United States Patent [19]
McAdams

[11] Patent Number: 5,642,321
[45] Date of Patent: Jun. 24, 1997

[54] VOLTAGE LEVEL DETECTION CIRCUIT

[75] Inventor: Hugh P. McAdams, Houston, Tex.

[73] Assignee: Texas Instruments Incorporated, Dallas, Tex.

[21] Appl. No.: 258,640

[22] Filed: Jun. 10, 1994

Related U.S. Application Data

[62] Division of Ser. No. 908,633, Jul. 2, 1992, Pat. No. 5,347,173, which is a continuation of Ser. No. 560,542, Jul. 31, 1990, abandoned.

[51] Int. Cl.$^6$ .................................................... G11C 7/00
[52] U.S. Cl. ............................. 365/226; 365/189.09
[58] Field of Search ........................... 365/226, 189.09; 307/296.4, 296.6; 327/535, 538, 546

[56] References Cited

U.S. PATENT DOCUMENTS

| | | | |
|---|---|---|---|
| 4,455,628 | 6/1984 | Ozaki et al. | 365/226 |
| 4,780,854 | 10/1988 | Watanabe et al. | 365/226 |

*Primary Examiner*—Joseph A. Popek
*Attorney, Agent, or Firm*—William W. Holloway; W. James Brady, III; Richard L. Donaldson

[57] ABSTRACT

A voltage level detection circuit is disclosed. The circuit is incorporated into a dynamic memory, integrated onto a single semiconductor substrate to which external voltage and reference potentials are applied. The dynamic memory contains an array of memory cells and circuitry for writing and reading information into and from the cells of the array. It contains an oscillator for generating an oscillator signal when the external voltage is above the reference potential. The voltage level detection circuitry is controlled by the oscillator signal, for controlling a voltage obtained from the external voltage, to the reading and writing circuitry and to the array to prevent the voltage from being applied unless the voltage is a lease of a predetermined minimum value. It may contain a circuit for sampling the obtained voltage during selected oscillator cycles to determine whether the obtained voltage is above the predetermined value. Other elements may be added to further enhance performance of the circuit.

12 Claims, 2 Drawing Sheets

VOLTAGE LEVEL DETECTION CIRCUIT

This is a divisional of application Ser. No. 07/908,633, filed Jul. 2, 1992 now U.S. Pat. No. 5,347,173; which is a continuation of application Ser. No. 07/560,542, Jul. 31, 1990, now abandoned.

FIELD OF THE INVENTION

This invention is in the field of integrated circuits, and is more specifically related to memory devices.

BACKGROUND OF THE INVENTION

The development of VLSI semi-conductor devices of the Dynamic Random Access Memory (DRAM) type is well known. Over the years, the industry has steadily progressed from DRAMS of the 16K type (as shown in the U.S. Pat. No. 4,081,701 issued to White, McAdams and Rewline), to DRAMS of the 64K type (as shown in U.S. Pat. No. 4,055,444 issued to Rao) to DRAMS of the 1 MB type (as shown in U.S. Pat. No. 4,658,377 issued McElroy), and progressed to DRAMS of the 4 MB type. The 16 MB DRAM, wherein more than 16 million memory cells are contained on a single semiconductor chip is the next generation of DRAMs scheduled for production.

In designing VLSI semiconductor memory devices of the 16 MB DRAM type, designers are faced with numerous challenges. One area of concern is power consumption. The device must be able to power the increased memory cells and the supporting circuits, However, for commercial viability, the device must not use excessive power. The power supplies used and the burn in voltage for the part must also be compatible with the thin gate oxides in the device.

Another area of concern is the elimination of defects. The development of larger DRAMS has been fostered by the reduction in memory cell geometries, as illustrated in U.S. Pat. No. 4,240,092 to KUO (a planar capacitor cell) and as illustrated in U.S. Pat. No. 4,721,987 to Baglee et. al. (a trench capacitor cell). The extremely small geometries of the 16 MB DRAM will be manufactured using sub-micron technology. The reduction in feature size has meant that particles that previously did not cause problems in the fabrication process, now can cause circuit defects and device failures.

In order to ameliorate defects, redundancy schemes have been introduced. The redundancy schemes normally consisted of a few extra rows and columns of memory cells that are placed within the memory array to replace defective rows and columns of memory cells. Designers need new and improved redundancy schemes in order to effectively and efficiently repair defects and thereby increase yields of 16 MB DRAM chips.

Another area of concern is testing. The device must have circuits to allow for the industry standards 16× parallel tests. In addition, other circuits and test schemes are needed for internal production use to verify operability and reliability.

The options that the device should have is another cause for concern. For instance, some customers require a X1 device, while others require a X4 device. Some require an enhanced page mode of operation. Additionally, it is yet undecided whether the DRAM industry will maintain 4096-cycle refresh, or move towards a lower number of refresh cycles.

Another cause for concern is the physical layout of the chip. The memory cells and supporting circuits must fit on a semiconductor chip of reasonable size. The size of the packaged device must be acceptable to buyers.

New design strategies and circuits are required to meet the above concerns, and other concerns, relating to the development of the next generation, and to future generations, of Dynamic Random Access Memory devices.

It is an object of this invention to provide a voltage level detection circuit. The circuit may be used to prevent voltage from being applied to a semiconductor device unless the voltage is at least of a predetermined value.

Other objects and advantages of this invention become apparent to those of ordinary skill in the art, having reference to the following specification, together with the drawings.

SUMMARY OF THE INVENTION

A voltage level detection circuit is disclosed. The circuit is incorporated into a dynamic memory, integrated onto a single semiconductor substrate to which external voltage and reference potentials are applied. The dynamic memory contains an array of memory cells and circuitry for writing and reading information into and from the cells of the array. It contains an oscillator for generating an oscillator signal when the external voltage is above the reference potential. The voltage level detection circuitry is controlled by the oscillator signal, for controlling a voltage obtained from the external voltage, to the reading and writing circuitry and to the array to prevent the voltage from being applied unless the voltage is a lease of a predetermined minimum value. It may contain a circuit for sampling the obtained voltage during selected oscillator cycles to determine whether the obtained voltage is above the predetermined value. Other elements may be added to further enhance performance of the circuit.

DETAILED DESCRIPTION OF THE PREFERRED EMBODIMENT

Figure 1:
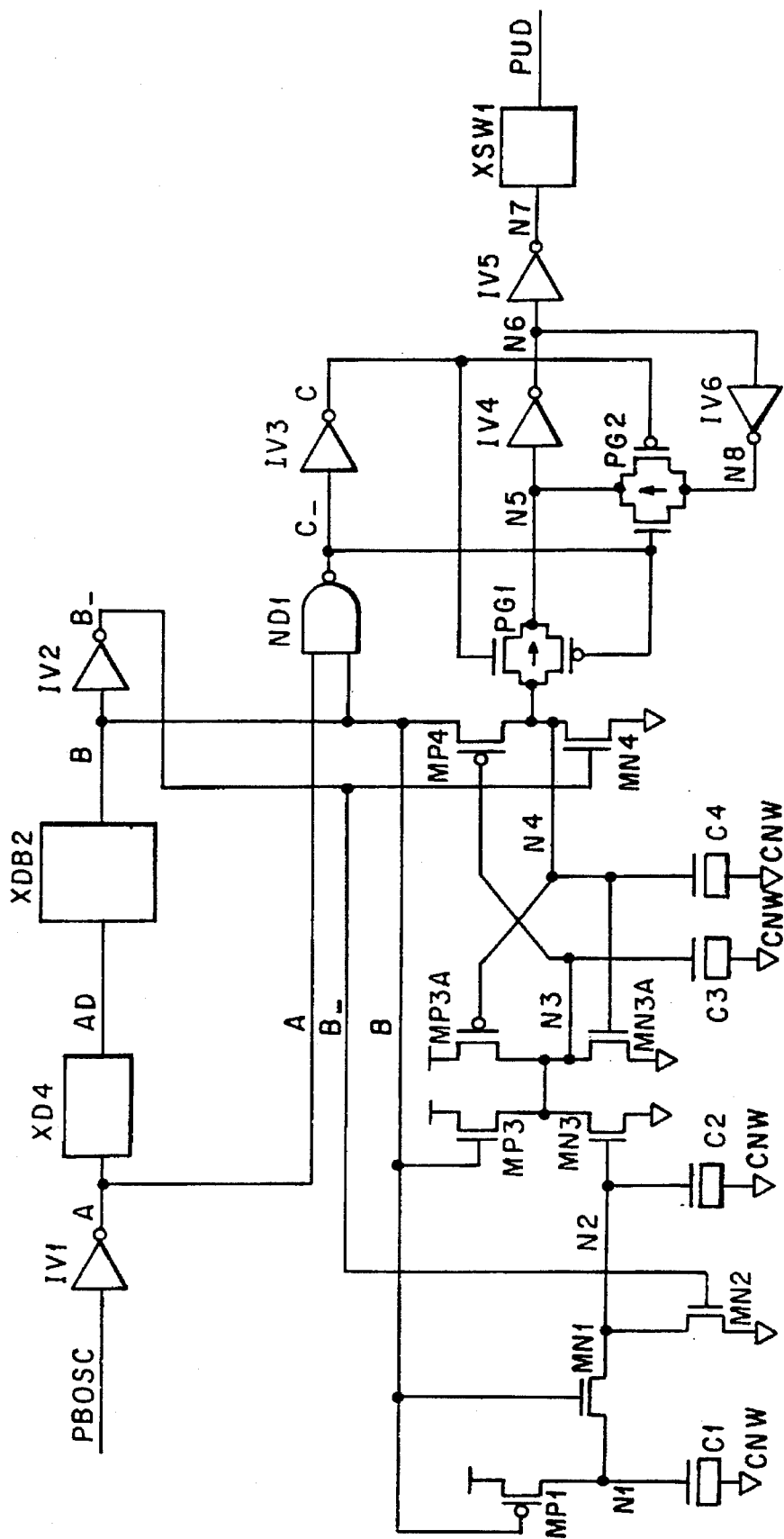
FIG. 1 illustrates the Level Detector Circuit, LVLDET.

FIG. 1 illustrates the level detection circuit LVLDET. Signal PBOSC is connected to inverter IV1. The output of inverter 119:IV1 is connected to the input of delay stage XD4. The output of delay stage XD4 is connected to the input of divide by two device XDB2. The output of divide by two device XDB2 is connected to the input of inverter IV2 at node B. The output of inverter IV2 is connected to NODE B_.

In FIG. 1, P channel transistor MP1 is connected between VPERI and NODE N1. Its gate is connected tc NODE B. The gate of N channel transistor C1 is connected to NODE N1. Its source and drain are connected together and connected to VSS. N channel transistor MN1 is connected between NODE N1 and NODE N2. Its gate is connected to NODE 119:B. N channel transistor MN2 is connected between NODE N2 and VSS. Its gate is connected to NODE B_. The gate of N channel transistor 119:C2 is connected to NODE N2. Its source and drain are connected together and connected to VSS.

In the level detection circuit of FIG. 1, the gate of N channel transistor MN3 is connected to NODE N2. The transistor MN3 is connected between NODE N3 and VSS. Transistor MN3A is also connected between NODE N3 and VSS. Its gate is connected to NODE N4. P channel transistor MP3 is connected between VPERI and NODE N3. Its gate is connected to NODE B. P channel transistor MP3A is also connected between VPERI and NODE N3. Its gate is connected to NODE N4. The gate of N channel transistor C3 is connected to NODE N3. Its source and substrate are connected together and connected to VSS. The gate of N channel transistors MN3A and C4 are connected together and connected to NODE N4. The source and substrate of transistor C4 are connected together and connected to VSS.

In FIG. 1, the output of inverter 119:IV1 is connected to the input of NAND gate ND1. The other input to NAND gate ND1 is NODE B. The output of NAND gate ND1 is connected to NODE C_. NODE C_is connected to the input of inverter IV3. The output of inverter IV3 is connected to NODE C. P channel transistor MP4 is connected between NODE B and NODE N4. Its gate is connected to NODE N3. N channel transistor MN4 is connected between NODE N4 and VSS. Its gate is connected to NODE B_. NODE N4 is connected to the input of pass gate device PG1. The N channel gate of pass gate device PG1 is connected to NODE C. The P channel gate of device PG1 is connected to NODE C_. The output of pass gate device PG1 is connected to NODE N5.

In the level detection circuit of FIG. 1, NODE N5 is coupled through inverter IV4 to NODE N6. NODE N6 is coupled through inverter IV6 to the input of pass gate device PG2. The output of pass gate device PG2 is connected to NODE N5. The N channel gate of the pass gate device PG2 is connected to NODE C_ and the P channel gate of the pass gate device is connected to NODE C. NODE 6 is coupled through inverter IV5 to one terminal of SWITCH XSW1. The other terminal of SWITCH XSW1 is connected to the PUD terminal. SWITCH XSW1 is illustrated in the open position.

LVLDET—LATCHING VOLTAGE LEVEL DETECTOR schematic FIG. 1.

FIG. 1 is an alternative embodiment of the PUD circuit.

LVLDET has a same function as PUD circuit. But LVLDET uses a different method in achieving a PUD (Power up Detector) output.

Figure 2:
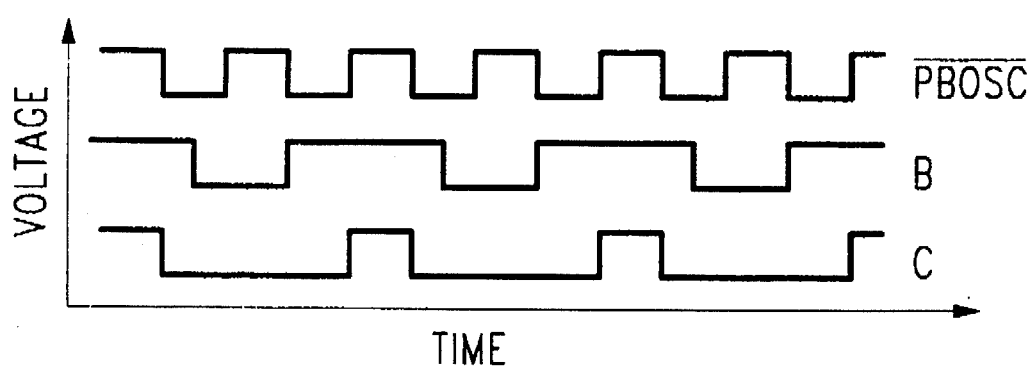
FIG. 2 is a signal diagram of the LVLDET circuit 119.

LVLDET uses PBOSC to sample the periphery voltage level. This voltage sampling is based on equalizing the voltage at node N2 and N1. To understand on how it works, lets take a look on the 'square' waveforms generated from PBOSC. These are illustrated in FIG. 2.

Two sets of main control waveforms are generated by PBOSC signal. They are waveform 'B'/'B_' and 'C'. These two sets of signal control the sampling of the periphery voltage. Note that XDB2 is a frequency divider circuit. It generates signal 'B' which has the frequency value of half PBOSC. As for XD4 it is a delay that causes the falling edge of 'B' to be about 4 ns later than its input falling edge.

Initially, when 'B' is low, node N1 of capacitor C1 is charged-up to the current periphery voltage. At the same time, it also charges up N3 and discharges N4 to low. Next, as 'B' goes high, it turns on MN1. This enables the charge sharing process to occur between N1 N2. The equilibrium voltage at N2 & N1 will be Veq, where;

$Veq=\{C1/(C1+C2)\}* Vperi$

If Veq is greater than the threshold voltage of MN3, node N3 will be discharged to ground with MN3 switched on. There is also a regenerative action that enhances this switching event. As the potential of N3 is pulled down, it turns on MP4. Thus with the high 'B' signal, it propagates to N4 and turns on MN3A to help the discharging of N3. But, if Veq is less than the threshold voltage, N3 remains high while N4 remains low. The VPERI needed to set Veq above this threshold can be preset be adjusting the capacitance C1 and C2.

Then as 'C' goes up, it allows the signal at node N4 to propagates to the output. If VPERI is not high enough, Veq will not be able to trip MN3. N4 is low and is the output. But if VPERI is high enough and Veq trips MN3, the output will be a logic '1'.

When 'C' signal drops low, the output is latched until next cycle. Signal 'B' goes down 8 ns after 'C' goes down to create a proper latching action.

To summarize, LVLDET samples the periphery voltages to determine if it has reached the required level before triggering the output to a logic '1'. Sampling is based on PBOSC frequency. It samples every two cycles of PBOSC, i.e. in the first cycle, VPERI is sampled and in the second cycle, the sampled status is sent to output.

The disclosed voltage level detection circuit is incorporated into a dynamic memory, integrated onto a single semiconductor substrate to which external voltage and reference potentials are applied. The dynamic memory contains an array of memory cells and circuitry for writing and reading information into and from the cells of the array. It contains an oscillator for generating an oscillator signal when the external voltage is above the reference potential. The voltage level detection circuitry is controlled by the oscillator signal, for controlling a voltage obtained from the external voltage, to the reading and writing circuitry and to the array to prevent the voltage from being applied unless the voltage is a lease of a predetermined minimum value. It may contain a circuit for sampling the obtained voltage during selected oscillator cycles to determine whether the obtained voltage is above the predetermined value. Other elements may be added to further enhance performance of the circuit.

The voltage level detection circuit of the invention advantageously can detect the level of the applied voltage without requiring a sharp transition, or "edge". It effectively senses slow rising external voltage.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. A dynamic memory integrated onto a single semiconductor substrate and receiving an external voltage, the memory comprising:

A. an array of memory cells on the substrate;

B. reading and writing circuits on the substrate for writing and reading information into and from the cells of the array;

C. an oscillator circuit on the substrate for generating an oscillator signal in response to receipt of the external voltage;

D. a voltage generation circuit on the substrate for generating a peripheral voltage to power the reading and writing circuitry in response to application of the external voltage; and E. control circuits on the substrate coupled between the voltage generation circuit and the reading and writing circuits, the control circuits applying the peripheral voltage to the reading and writing circuits in response to application the oscillator signal and in response to the peripheral voltage being greater than a certain level.

2. The memory of claim 1 in which the oscillator signal is a square wave.

3. The memory of claim 1 in which the control circuits includes sampling circuits for sampling the peripheral voltage during selected oscillator signal cycles to determine whether the peripheral voltage is greater than the certain voltage level.

4. The memory of claim 3 in which the control circuits include latch circuits selectively latching a high or a low level signal for output depending upon whether the peripheral voltage is greater than the certain level.

5. The memory of claim 4 in which the sampling circuits and the latch circuits operate in alternating oscillator cycles.

6. The memory of claim 5 in which the control circuits include a divide by two circuit to divide the oscillator cycles into alternating groups of cycles.

7. The memory of claim 3 in which the sampling circuits include:

A. first and second capacitors connected from respective first and second nodes to a VSS potential;

B. first circuits connecting the peripheral voltage to one of the capacitors;

C. second circuits connecting the VSS potential to the other of the capacitors;

D. oscillator divider circuits producing a divided oscillator signal from the oscillator signal;

E. a switch operated in response to changing states of the divided oscillator signal alternately to isolate and connect the first and second nodes;

F. third circuits to isolate the first and second capacitors from the peripheral voltage and the VSS potential when the switch is operated to connect together the first and second nodes; and G. a transistor receiving the voltage of the second node and having a conduction voltage threshold of the certain value, the transistor conducting when the voltage on the second node is greater than the certain value.

8. The memory of claim 7 including latch circuits that latch a high or low signal level for output depending upon the conduction state of the transistor.

9. The memory of claim 8 in which the latch circuits latch the signal level in response to the divided oscillator signal.

10. A dynamic memory integrated onto a single semiconductor substrate and receiving an external voltage, the memory comprising:

A. an array of memory cells on the substrate;

B. reading and writing circuits on the substrate for reading and writing information into and from the cells of the array;

C. an oscillator circuit on the substrate for generating an oscillator signal in response to receipt of the external voltage;

D. a voltage generation circuit on the substrate for generating a peripheral voltage to power the reading and writing circuitry in response to receipt of the external voltage; and E. control circuits on the substrate coupled between the voltage generation circuit and the reading and writing circuits, the control circuit applying the peripheral voltage to the reading and writing circuits in response to the oscillator signal and in response to the peripheral voltage being greater than a certain level, the control circuits including sampling circuits for sampling the peripheral voltage during selected oscillator signal cycles to determine whether the peripheral voltage is greater than the certain voltage level, the sampling circuits including:

i. first and second capacitors connected between respective first and second nodes and a VSS potential, the ratio of the capacitance values of the first and second capacitors, when connected together, determining an equilibrium voltage level related to the peripheral voltage;

ii. first circuits connecting the peripheral voltage to one of the capacitors;

iii. second circuits connecting the VSS potential to the other of the capacitors;

iv. oscillator divider circuits producing a divided oscillator signal from the oscillator signal;

v. a switch operated in response to changing states of the divided oscillator signal alternately to isolate and interconnect the first and second nodes, when connected the first and second nodes carrying the equilibrium voltage;

vi. third circuits to isolate the first and second capacitors from the peripheral voltage and the VSS potential when the switch is operated to connect together the first and second nodes;

vii. a transistor receiving the equilibrium voltage of the second node and having a conduction voltage threshold related to the equilibrium voltage to indicate the peripheral voltage is greater than the certain value, the transistor conducting when the equilibrium voltage on the second node attains the conduction voltage threshold to control a voltage on a third node to be a high or a low level; and viii. a latch circuit latching the voltage on the third node.

11. The memory of claim 10 in which the oscillator signal is a square wave.

12. The memory of claim 11 in which the oscillator divider circuits divide the oscillator signal by two and the sampling circuits sample the peripheral voltage on first alternating oscillator signal cycles and the latch circuits latch the voltage on the third node on second alternating oscillator signal cycles between the first alternating oscillator signal cycles.

\* \* \* \* \*